United States Patent [19]

Lamarche et al.

[11] Patent Number: 5,977,662

[45] Date of Patent: Nov. 2, 1999

[54] ELECTRONIC SWITCHING DEVICE AND CIRCUITS WITH A PLURALITY OF SUCH SWITCHING DEVICES

[75] Inventors: Jean-Luc Lamarche, Mittelhuasbergen, France; Karl Herrmann, Wangen-Haslach; Manfred Strobel, Weingarten, both of Germany

[73] Assignee: i f m electronic GmbH, Essen, Germany

[21] Appl. No.: 08/859,323

[22] Filed: May 20, 1997

[30]  Foreign Application Priority Data

May 20, 1996 [DE] Germany .......................... 196 19 904
May 20, 1996 [DE] Germany .......................... 196 20 065

[51] Int. Cl.⁶ .................................................. H01H 47/00
[52] U.S. Cl. .......................... 307/125; 307/116; 324/510; 340/686; 327/517
[58] Field of Search ................................... 307/116, 125; 361/179; 324/510, 537; 327/517; 340/686, 687

[56]  References Cited

U.S. PATENT DOCUMENTS

| | | |
|---|---|---|
| 4,271,763 | 6/1981 | Berger . |
| 4,323,890 | 4/1982 | Lemke ..................................... 340/524 |
| 4,617,829 | 10/1986 | Tarassoff ............................... 73/865.8 |
| 4,879,474 | 11/1989 | Lamarche .............................. 307/116 |
| 4,918,326 | 4/1990 | Lamarche .............................. 307/116 |
| 5,408,132 | 4/1995 | Fericean et al. . |
| 5,487,448 | 1/1996 | Schollkopf et al. ..................... 187/247 |
| 5,528,219 | 6/1996 | Frohlich et al. ........................ 340/540 |

FOREIGN PATENT DOCUMENTS

| | | |
|---|---|---|
| 0 459 478 | 12/1991 | European Pat. Off. . |
| 23 30 233 | 1/1975 | Germany . |
| 31 23 828 | 2/1982 | Germany . |
| 32 14 836 | 11/1983 | Germany . |
| 32 19 270 | 11/1983 | Germany . |
| 33 40 992 | 5/1985 | Germany . |
| 37 06 325 | 9/1988 | Germany . |
| 40 23 502 | 2/1992 | Germany . |
| 41 14 763 | 11/1992 | Germany . |
| 42 30 790 | 3/1994 | Germany . |
| 43 05 385 | 8/1994 | Germany . |
| 43 37 518 | 4/1995 | Germany . |
| 61-251324 | 11/1986 | Japan . |

*Primary Examiner*—Fritz Fleming
*Assistant Examiner*—Jonathan S. Kaplan
*Attorney, Agent, or Firm*—Sixbey, Friedman, Leedom & Ferguson; David S. Safran

[57]  ABSTRACT

An electronic proximity switching device with a proximity indicator and with an electronic switch which can be controlled by the proximity indicator. A plurality of these switching devices can be series connected without an unacceptable voltage drop occurring on the series connection when the switching devices are conductive, by the electronic switch of each switching device being connected to one input (2) of an AND element (3), another input (4) of the AND element (3) representing a control input (5) of the switching device, the output (6) of the AND element (3) representing the output (7) of the switching device, and load current flowing via the AND element (3) in the conductive state of the switching device. In other words there is AND element (3) in addition to an inductive proximity switch (1). A circuit for monitoring of the state of a system, for example, a fault state in an aerial railway or chairlift system, is provided with a plurality of switching devices (10), and with a control and evaluation unit (11), the switching devices (10) being series connected to one another and to the control and evaluation unit (11). When a fault state of the system is detected by the series connection of all switching devices (10), the fault can be located by interrogation of the switching devices with respect to their state (make or break contact state).

13 Claims, 2 Drawing Sheets

ELECTRONIC SWITCHING DEVICE AND CIRCUITS WITH A PLURALITY OF SUCH SWITCHING DEVICES

BACKGROUND OF THE INVENTION

1 Field of the Invention

The invention relates to an electronic switching device, preferably with a proximity indicator, for example, an oscillator, and with a an electronic switch which can be controlled by a proximity indicator, optionally via a switching amplifier. Furthermore, the invention relates to a circuit for monitoring of the satisfactory state and/or detection of a faulty state of a system, for example, a aerial railway or chairlift system, with a plurality of monitoring and detection devices and with at least one control and evaluation unit, the monitoring and detection devices being made as electronic switching devices of the aforementioned type and being series connected to one another and to the control and evaluation unit.

2 Description of Related Art

Electronic switching devices of the type to which the invention is directed are made of solid-state construction and have been increasingly used for almost thirty years instead of mechanically activated, electrical switching devices which have contacts, especially in electrical or electronic measurement and control circuits. In a contact-type switching device, either an electronic switch which was initially nonconductive becomes conductive (make contact type), an electronic switch which was initially conductive becomes nonconductive or blocked (break contact). This applies particularly to proximity switches, i.e., to proximity electronic switching devices.

With proximity switching devices, it is indicated whether an influence element to which the corresponding proximity switch is sensitive has approached near enough to the proximity switch. If, specifically, the influence element to which the corresponding proximity switch is sensitive has approached the proximity switch closely enough, the proximity indicator switches the electronic switch. With switching devices of the type under consideration, it can also be indicated whether a physical quantity of an influencing medium to which the switching device is sensitive has reached a corresponding value.

Thus, one important component of electronic switching devices of the type under consideration is, among others, the proximity indicator which can be externally influenced. In inductive or capacitive proximity switches, the proximity indicator is generally an inductively coupled oscillator or a capacitively coupled oscillator. Optoelectronic proximity switches have a photoresistor, a photodiode, or a phototransistor as the proximity indicator. Otherwise, electronic switching devices of the type to which the invention is directed include, for example, also so-called flow indicators which have a temperature measurement circuit.

Electronic switching devices of the type under consideration are often made as so-called two-wire switching devices, i.e., they can be connected via an external lead to one pole of a voltage source and only via another external lead to one terminal of a consumer, the other terminal of the consumer being connectable to the other pole of the voltage source.

In electronic switching devices which can be connected only via one external lead to one pole of a voltage source and only via one other external lead to one terminal of a consumer, it is not a problem to make available the operating voltage (=internal operating voltage) or the operating current required by the proximity indicator, and optionally, also the switching amplifier. This is because the internal operating voltage or operating current must be made available both in the conductive and also in the blocked state.

It is irrelevant whether an operating current or an internal operating voltage is made available, since the proximity indicator, and optionally the switching amplifier, of course require electrical power. Therefore, both an internal operating voltage and also operating current are required (compare the representation of these circumstances in German patent document 23 30 233, especially in column 5, line 68, to column 6, line 33).

Based on their function as switching devices, in the switching devices under consideration, in the conductive state almost no voltage drop will occur and in the blocked state almost no residual current will flow. However, it applies to all two-wire switching devices that, in the conductive state a voltage drop occurs and in the blocked state a residual current flows since, if no voltage drop were to occur in the two-wire switching devices in the conductive state, since no internal operating voltage for the proximity indicator and optionally the switching amplifier could be obtained, if in the blocked state no residual current were to flow, nor could any operating current be obtained.

It has already been stated initially that electronic switching devices of the type under consideration are used in measurement and control circuits. In particular, a plurality of switching devices of the type under consideration are often required in control circuits. The individual switching devices can be located relatively far apart and relatively great distances can be bridged between the individual switching devices and a central control, so that wiring of the switching devices among one another and to a central control can be expensive.

It has also been already stated initially that electronic switching devices of the type under consideration can be made as make contacts or a break contacts, In safety-relevant control circuits, switching devices made as break contacts are used since the safe state must be the de-energized state. The use of switching devices of the type under consideration made as break contacts, in safety relevant control circuits, requires series connection of all switching devices. If, in this series connection, only one switching device made as a break contact is not influenced, the electronic switch to which this switching device belongs is blocking, the circuit formed by series connection of all of the switching devices is de-energized.

As noted above, on switching devices which are made as two-wire switching devices, a voltage drop also occurs in the conductive state, as necessary for operation; this voltage drop can be roughly 5–10 V or even more throughout. In the series connection of a plurality of switching devices of the type under consideration, the voltage drop which occurs throughout the series connection of these switching devices can easily assume a value which is no longer acceptable.

Electronic switching devices of the type under consideration are made of a solid-state construction, as noted initially. Instead of the contact provided in an electrical switching device, there is an electronic switch. Even in those electronic switching devices of the type under consideration which are made not as two-wire switching devices, but as three-wire switching devices, in the conductive state, a voltage drop occurs which is not negligible. This voltage drop can also be added to a voltage drop which is no longer acceptable in the series connection of a plurality of switching devices of the type under consideration.

Systems of the most varied type, especially so-called safety-relevant systems, often require continual monitoring, i.e., monitoring of the satisfactory state, and generally in conjunction with monitoring of the satisfactory state, the detection of a faulty state. As soon as a faulty state has been detected, a safety-relevant measure is initiated.

In aerial railway and chairlift systems, the location of the cable relative to the cable rollers guiding the cable or carrying the cable must be monitored as the safety-relevant criterion. If the actual position of the cable relative to at least one cable roller does not correspond to the theoretical position, safety-relevant measures must be taken. For a slight deviation between the actual position of the cable and its theoretical position, the safety-relevant measure derived therefrom can be a reduction of cable speed. If the deviation between the actual position of the cable and the theoretical position exceeds a stipulated boundary value, the safety-relevant measure consists, in any case, in that the aerial railway system or chairlift system is instantaneously shut down.

In electrical, and today of course also in electronic circuits which act as control circuits, a distinction is made between the open circuit principle and the closed circuit principle. In the open circuit principle, for example, there is a control intervention into a system, for example, when a large enough control current flows in the control circuit. Switching devices in control circuits operating according to the open circuit principle are made as make contacts; they are electrically conductive when they are actuated. In contrast, in the closed circuit principle, for example, there is a control intervention into the system when no control current flows in the control circuit. Switching devices in control circuits operating according to the closed circuit principle are made as break contacts; they are electrically nonconductive when they are actuated.

In control circuits operating according to the open circuit principle, as was mentioned above, there is a control intervention into an assigned system when a sufficiently large control current flows in the control circuit. Therefore, the prerequisite for this is that, on the one hand, the necessary operating voltage is present, on the other hand, that there is no line break, and finally, that the switching device which is made as a make contact and which is present in this control circuit is serviceable. In contrast, in a control circuit which operates according to the closed circuit principle, there is a control intervention into a system belonging to it if no control current flows in the control circuit.

The aforementioned statements on the open circuit principle and the closed circuit principle make it clear that control circuits which are designed to trigger safety-relevant measures must operate according to the closed circuit principle. Since the de-energized state in the control circuit is evaluated such that the corresponding system is in the safe state, a failure of the operating voltage and a line break always lead to the system, if it is not in the safe state, being moved into the safe state. In an aerial railway or in a chairlift system, the safe state is of course for the cable drive to be turned off.

In control circuits operating according to the open circuit principle, therefore, in control circuits in which the switching devices are made as make contacts, the switching devices are connected in parallel; after actuating a switching device made as a make contact, the control circuit becomes active again. Conversely, in control circuits operating according to the closed circuit principle, therefore, in control circuits in which the switching devices are made as break contacts, the switching devices are connected in series, after actuating a switching device made as a break contact, the control circuit becomes de-energized and thus entirely active.

SUMMARY OF THE INVENTION

A primary object of the invention is to embody and develop an electronic switching device, preferably a proximity switching device, such that a plurality, even an unlimited number of switching devices can be easily series connected without an unacceptable voltage drop occurring on the series connection in the conductive state of all switching devices.

This object and others are achieved by an electronic switching device according to the invention in which the electronic switch is connected to one input of an AND element, the other input of the AND element represents the control input of the switching device, the output of the AND element represents the output of the switching device, and in the conductive state of the switching device, the load current flows via the AND element. This means the following:

In the sense of the terminology used above—control input, output—in the electronic switching devices underlying the invention, the electronic switch essentially represents the output of the switching device; via the electronic switch, there flows the load current of the circuit in which the electronic switching device is located. Specifically the electronic switch, of course, has two load current carrying terminals (and generally one control terminal), and one of these two load current carrying terminals is called the load current output, here the output. If, as stated above, the electronic switch is connected to one input of an AND element, this therefore means that the load current carrying terminal of the electronic switch which represents the output of the switching device in the known electronic switching devices underlying the invention is connected to one input of an AND element. The other input of the AND element represents the control input for the electronic switching device according to the invention, which is not present in the known electronic switching devices. In the electronic switching device according to the invention, the output of the AND element corresponds functionally to the load current carrying terminal of the electronic switch of the known electronic switching device, which represents the output of the switching device in this known electronic switching device.

The electronic switching device according to the invention can also be described in that it formed of a known electronic switching device, preferably, a proximity switching device, and also an AND element, the output of the known electronic switching device being connected to one input of the additional AND element, the other input of the additionally present AND element representing an additional control input, and the output of the AND element representing the output of the switching device which is represented by one of the two load current carrying terminals of the electronic switch in the known switching device.

It was mentioned above that the switching device according to the invention is embodied and developed such that a plurality of these switching devices can be series connected without an unacceptably high voltage drop occurring on this series connection if all switching devices are conductive. Consequently, the subject of the invention is also a circuit with a plurality of switching devices according to the invention which is characterized in that the output of the first switching device is connected to the control input of the second switching device, the output of the second switching device is connected to the control input of the third switching device, and the output of switching device is connected to the control input of switching device.

The term "AND element" requires explanation. Within the framework of the invention, it is defined as any component or any circuit which then has one "conductive output," such as the conductive output of a known electronic switching device, if there is a control signal above a trigger threshold at the two inputs. Otherwise, the AND element in the electronic switching device according to the invention must be made such that when there is an input signal above a trigger threshold at its two inputs, via the AND element there can flow the load current of the circuit in which there is the electronic switching device according to the invention. The AND element functionally replaces the electronic switch, which in the known switching devices, carries the load current of the circuit in which this switching device is located.

It follows from what has been stated above with reference to the AND element used in the electronic switching device according to the invention that the voltage drop which occurs on the conductive switching device according to the invention is the voltage drop which occurs on the AND element acting as the electronic switch. The execution of the switching devices according to the invention and the aforementioned "pseudo-series connection" of the switching devices according to the invention result in the voltage drops on each switching device according to the invention not being added. Regardless of what number of switching devices according to the invention form the "pseudo-series connection" under consideration, the voltage drop which occurs throughout is equal to the voltage drop which occurs on the switching device according to the invention.

So that in a circuit for monitoring the fitness and/or detecting the faulty state of a system, when a faulty state of the system has been detected by the series connection of all monitoring and detection devices, and the fault can be located, it is provided according to the invention that the monitoring and detection devices can be interrogated with respect to their state.

If the circuit according to the invention is used, for example, to monitor the satisfactory state and detect the faulty state of an aerial railway system or a chairlift system, this circuit can easily include fifty or more monitoring and detection devices distributed over several hundred meters. Because, according to the invention, the monitoring and detection devices can be interrogated with regard to their state, when a faulty state has been detected, it can be ascertained where the fault has occurred, so that the fault can be easily corrected.

So that the series connection of the monitoring and detection devices, made as switching devices of the above described type, said series connection being essential to the circuit according to the invention, does not lead to an unacceptable voltage drop, another teaching of the invention which is especially important is that, in all monitoring and detection devices made as electronic switching devices, the electronic switch is connected on the output side to one input of an AND element, the other input of the AND element represents the control input of the switching device, the output of the AND element represents the output of the switching device, and the output of the first switching device is connected to the control input of the second switching device, the output of the second switching device is connected to the control input of the third switching device, and the output of switching device is connected to the control input of switching device.

The basic teaching of the invention is, as stated above, that the monitoring and detection devices can be interrogated with respect to their state. If, at this point, the monitoring and detection devices, as stated above, are made as switching devices, they can then be interrogated with respect to their circuit state. For this reason, it is recommended that switching devices be used which can be reversed by a reversing signal with respect to their switch function, i.e., make contact or break contact. This reversing with respect to switch function, make contact or break contact, is not uncommon in electronic proximity switching devices (see German patents 31 23 828, 32 14 836, 40 23 502 and 41 41 763).

According to another teaching of the invention which has special importance, in the circuit according to the invention, the switching devices can be interrogated not only with respect to their circuit state, but can also be addressed. This means that each individual switching device is individualized by a specific address being assigned to it. For interrogation of the state of a specific switching device, therefore, the switching device individualized by its address is "addressed" and then its circuit state is interrogated.

Basically, it is possible to connect the switching devices of the circuit according to the invention to one bus, and via the bus, to address the individual switching devices and interrogate them with respect to their state. However, in one preferred embodiment of the circuit according to the invention, the switching devices and the control and evaluation unit form a ring with respect to the interrogation and addressing possibility via corresponding interconnecting cables.

In one preferred embodiment of the circuit according to the invention, the switching devices and the control and evaluation unit each have a telegram unit. Preferably, the telegram units of the switching devices are made such that an address can be stored in them, that they can process a received telegram and that they can send a received telegram, optionally after processing. If the switching devices and the control and evaluation unit form a ring with respect to the interrogation and addressing possibility, the following applies:

The control and evaluation unit generates a telegram which proceeds from the control and evaluation unit via an interconnecting cable to the telegram unit of the first switching device; the control and evaluation unit, therefore, sends a telegram to the first switching device. This telegram, which is described in particular below, on the one hand, contains address information, and on the other hand, contains other information. In the telegram unit of the first switching device, the telegram originating from the control and evaluation unit is processed when the address information contained in it corresponds to the address of the first switching device. Afterwards, the processed telegram is forwarded by the telegram unit of the first switching device to the telegram unit of the second switching device, etc. Therefore, telegram units of the switching devices are telegram receiving, processing and transmitting units, while the telegram unit of the control and evaluation unit is a telegram generating, transmitting, receiving and evaluation unit. The control and evaluation unit can also have two different telegram units, specifically, on the one hand, a telegram generation and transmission unit, and on the other, a telegram receiving and evaluation unit.

As described above, in the circuit according to the invention, the switching devices, as dictated by operation, have one output and preferably, the telegram unit described above. In addition, the switching devices can have another information output which is unrelated to safety considerations, the information outputs of all switching devices being connected to one another and to the control and evaluation unit.

How the switching devices are specifically made in a circuit according to the invention depends mainly on how the system is made in particular, in which, using the circuit according to the invention, the satisfactory state is to be monitored and a faulty state detected. If this system is an aerial railway or chairlift system, it can be advantageous that each switching device has three proximity indicators and the proximity indicators are logically interconnected on the output side, directly or indirectly.

In particular, there are various possibilities for embodying and developing the switching device according to the invention and the circuit according to the invention. The details of these and other embodiments and developments in accordance with the present invention will be come clear from the following descriptions in conjunction with the accompanying drawings.

DETAILED DESCRIPTION OF THE PREFERRED EMBODIMENTS

Figure 1:
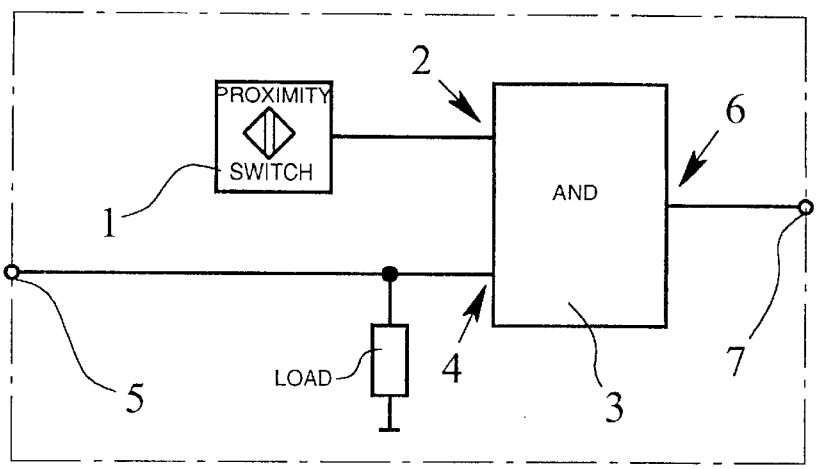
FIG. 1 schematically shows a preferred embodiment of a switching device according to the invention.

FIG. 1 shows, in highly schematic form, an electronic proximity switching device, with a proximity indicator, for example, an oscillator, and with an electronic switch (not shown). The switching device can be controlled by the proximity indicator, and optionally, via a switching amplifier (not shown). The proximity indicator which forms a component of the electronic switching device according to the invention can be a conventional inductive proximity switch 1 of the type that is mentioned in the Background portion of this application and which is sufficiently known as to require no further explanation.

As FIG. 1 shows, an output side of the inductive proximity switch 1 is connected to an input 2 of an AND element 3. A control input 5 is provided by the other input 4 of the AND element 3 and the output 6 of AND element 3 represents the output 7 of the switching device.

In the electronic switching devices underlying the invention, the electronic switch essentially represents the output of the switching device; via the electronic switch flows the load current of the circuit in which the electronic switching device is located. Of course, the electronic switch has two load current carrying terminals (and generally one control terminal), one of these two load current carrying terminals being called the load current output, here the output. If we consider this, it also applies to the electronic switching device shown in FIG. 1 that the electronic switch is connected with its load current output to input 2 of AND element 3. The known electronic switching devices underlying the invention do not have a control input of the type which is provided in the electronic switching device according to the invention in the form of the other input 4 of AND element 3. Output 7 provided in the electronic switching device according to the invention, represented by the output 6 of the AND element 3, corresponds to the load current carrying terminal of the electronic switch of the known electronic switching device which represents the output of the switching device in the known electronic switching device.

Figure 2:
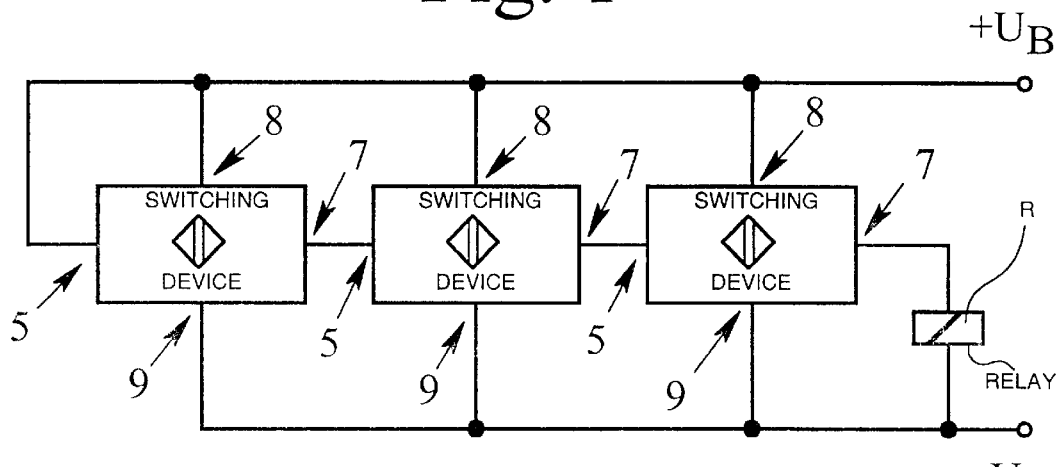
FIG. 2 shows a circuit with a plurality of switching devices according to the invention.

FIG. 2 shows a circuit with a plurality of switching devices according to the invention, for example, according to FIG. 1. Specifically, there are three switching devices according to the invention in the circuit shown in FIG. 2. Here, the output 7 of the first switching device is connected to the control input 5 of the second switching device and the output 7 of the second switching device is connected to the control input 5 of the third switching device.

It applies to the electronic switching device according to the invention that the AND element 3 has a conductive output 6, and the output 7 of the inventive switching device is, therefore, conductive when there is a control signal above an operating threshold at the two inputs 2 and 4 of the AND element 3. This control signal, on the one hand, proceeds from the electronic switch which is not shown, therefore, essentially from the output of the inductive proximity switch 1, to input 2 of the AND element 3, and on the other, is sent to the input of the AND element 3 via control input 5.

In the electronic switch according to the invention, viewed from the outside anyway, the AND element 3 functionally replaces the electronic switch which, in the known switching devices, carries the load current of the circuit in which this switching device is provided. Therefore, the load current of the circuit in which the electronic switching device according to the invention is provided flows via the AND element 3 of the electronic switching device according to the invention.

It applies to the electronic switching device according to the invention that the voltage drop which occurs on the conductive switching device is the voltage drop which occurs on the AND element 3 which acts as an electronic switch.

The execution of the switching device according to the invention and the "pseudo-series connection" of several switching devices according to the invention shown in FIG. 2 results in the voltage drops on each switching device according to the invention not being added. Regardless of what number of switching devices according to the invention form the "pseudo-series connection" shown in FIG. 2, the voltage drop which occurs throughout is equal to the voltage drop which occurs on the inventive switching device.

With regard to the circuit shown in FIG. 2, with a plurality of switching devices according to the invention, it should be pointed out that it is shown here that each switching device, besides control input 5 and output 7, has two voltage or current supply terminals 8, 9 which are not shown in FIG. 1. Control input 5 of the first switching device, like voltage and current supply terminals 8, is at the positive pole of the power supply voltage $U_B$. Between output 7 of the third, therefore the last, switching device and the negative pole of power supply voltage $U_B$, there is a relay R as the load. If all of switching devices are influenced, therefore, all electronic switches of the inductive proximity switch 1 which forms one component of the electronic switching devices are conductive, all AND elements 3 are conductive, and the load current flows from the positive pole of power supply voltage $U_B$ via the AND element 3 of the last switching device and via relay R.

Finally, it should be pointed out that, when the switching devices according to the invention are used in the circuit according to FIG. 2, the serviceability of all switching devices can be easily verified, specifically by the first switching device being influenced to check the serviceability of all switching devices. Even if only one switching device is out of order, then the last switching device is not conductive either.

Figure 3:
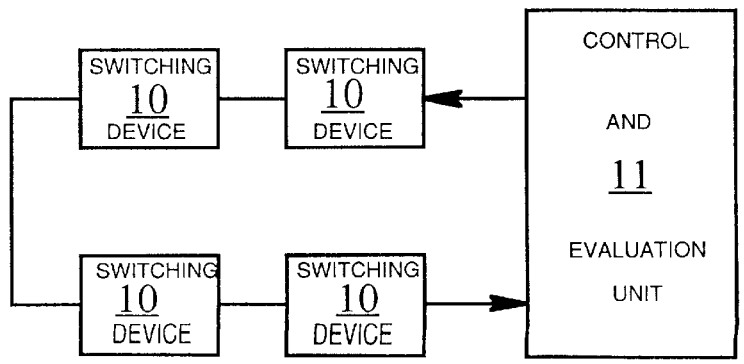
FIG. 3 is a block diagram of a first preferred embodiment of a switching device according to the invention.
Figure 4:
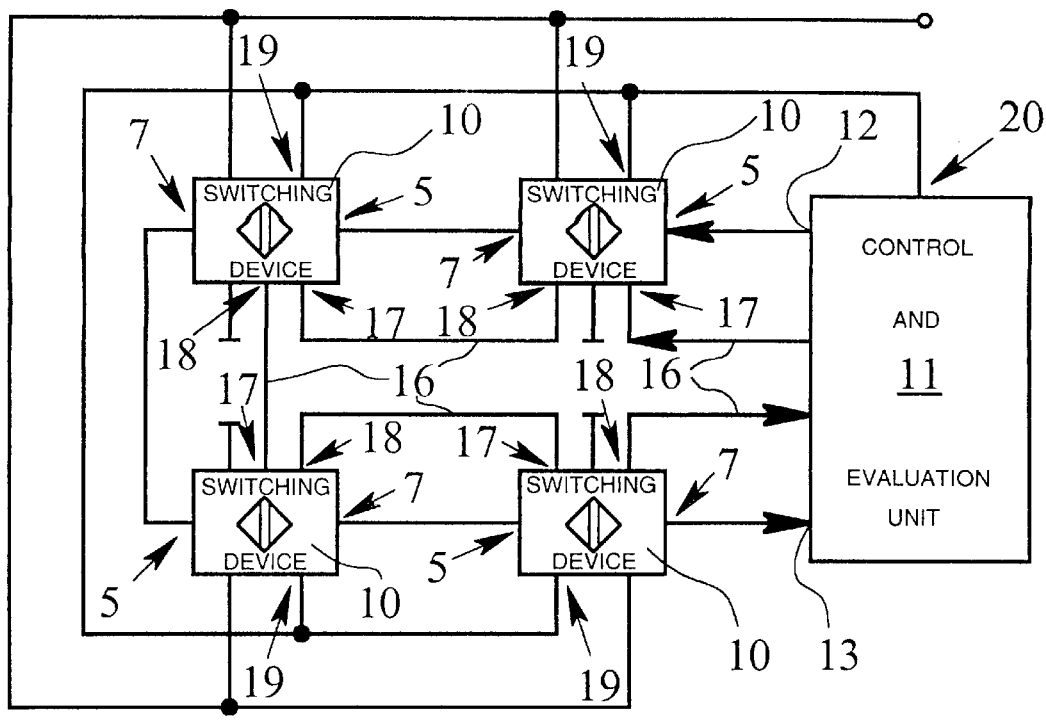
FIG. 4 schematically shows a second preferred embodiment of a switching device according to the invention.
Figure 5:
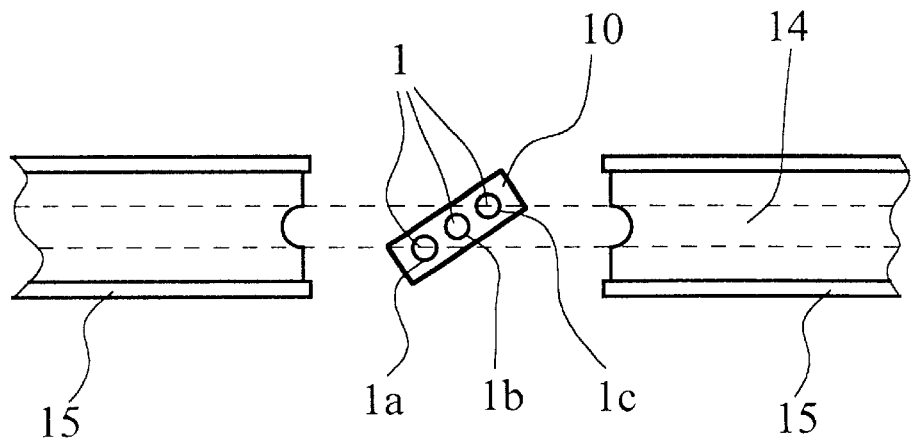
FIG. 5 schematically depicts a portion of an aerial railway or chairlift system utilizing the circuit according to the invention.

The circuit shown in FIGS. 3 and 4 is designed to monitor the satisfactory state and detect the fault state of a system, for example, an aerial railway or chairlift system, only a portion of which is shown only in FIG. 5, and which has a basic structure comprised of a plurality of switching devices 10 which are used as monitoring and detection devices, and of a control and evaluation unit 11. Switching devices 10 are connected to one another and are series connected to the control and evaluation unit 11.

FIGS. 3 and 4 each show only four switching devices 10. But, generally, the circuit according to the invention can include any number of switching devices 10; for example, in a circuit for monitoring the satisfactory state and detecting the fault state of an aerial railway or chairlift system, fifty or more switching devices 10 can easily be necessary, distributed over a distance of several hundred meters.

If a fault state of the system, for example, an aerial railway or chairlift system, has been detected by the series connection of all switching devices 10, and the fault can be easily located, according to the invention, it is provided that switching devices 10 can be interrogated with respect to their state to determine the location of the fault.

How the switching devices 10 of a circuit according to the invention are specifically constructed depends on what the particular type system is. In many cases, switching devices 10 can be made as electronic proximity switching devices, especially as capacitive or inductive proximity switches. If a system in which the satisfactory state is to be monitored and the fault state is to be detected is an aerial railway or chairlift system, the switching devices 10 can be made especially as inductive proximity switches. These inductive proximity switches have a proximity indicator, specifically an oscillator, and an electronic switch which can be controlled by the proximity indicator, therefore by the oscillator, generally via a switching amplifier. Electronic proximity switching devices, especially inductive and capacitive proximity switches, are sufficiently known and do not require a detailed description here.

For the aforementioned reasons, for a safety-relevant circuit using the closed circuit principle, switching devices 10 are series connected to one another and to control and evaluation unit 11. Therefore, the preferred embodiments of the circuits according to the invention shown include specially designed switching devices 10 of the type schematically shown in FIG. 1. One component of switching devices 10 is, first of all, as noted above, a conventional inductive proximity switch 1. As FIG. 1 shows, inductive proximity switch 1 is connected on the output side to input 2 of AND element 3. Control input 5 is represented by other input 4 of AND element 3 and output 7 of switching device 10 is represented by output 6 of AND element 3.

As FIG. 4 shows, control output 12 of control and evaluation unit 11 is connected to control input 5 of first switching device 10, output 7 of first switching device 10 is connected to control input 5 of second switching device 10, output 7 of second switching device 10 is connected to control input 5 of third switching device 10, output 7 of third switching device 10 is connected to control input 5 of fourth switching device 10, and output 7 of fourth switching device 10 is connected to control input 13 of control and evaluation unit 11.

As already detailed, it applies to the circuit according to the invention that switching devices 10 can be interrogated with respect to their circuit state. To do this, switching devices 10 can be reversed with respect to their switch function, make contact or break contact, by a reversing signal. Furthermore, switching devices 10 can be addressed; this is detailed below.

In the embodiments of the circuits according to the invention shown in FIGS. 3 and 4 and described as above, interrogation of the circuit state proceeds as follows:

First, it is assumed that the aerial railway and chairlift system is in a satisfactory state; the actual location of cable 14 relative to cable rollers 15 shown in FIG. 5 corresponds to the theoretical position. The switching devices 10, made as break contacts, are electrically conductive because there is no fault. Consequently, the circuit formed by the series connection or by the "pseudo-series connection" of all switching devices 10 and control and evaluation unit 11 is closed.

Now, let it be assumed that, at one location, the actual position of cable 14 deviates from its theoretical position. This is recognized as a fault by the corresponding switching device 10. Consequently, the corresponding switching device 10 is electrically nonconductive so that the circuit which is closed in the satisfactory state is now interrupted. Using control and evaluation unit 11, this leads to the aerial railway or chairlift system instantaneously being moved into the safe state; in particular, the cable drive is shut down and braked, and secures cable 14, for example. Now, the fault will be located. To do locate the fault, each of the individual switching devices 10 is "addressed" in succession and supplied with a reversing signal. Sending a reversing signal to switching devices 10 in which the actual position of cable 14 agrees with the theoretical position leads to electrically conductive switching devices 10 being reversed from the electrically conductive to the nonconductive state, while any switching device 10 in which the actual position of cable 14 deviates unduly from the theoretical position is reversed from the electrically nonconductive state into the conductive state. Now, control and evaluation unit 11 detects the reversal of any switching device 10 in which the actual position of cable 14 deviates unduly from the theoretical position because reversal of this switching device 10 leads to the circuit formed by all of the switching devices 10 and the control and evaluation unit 11 being closed again.

For the embodiment of a circuit according to the invention shown in FIG. 4, it now holds, furthermore, that switching devices 10 and control and evaluation unit 11 form a ring with respect to the interrogation and addressing possibility via corresponding interconnecting cables 16.

Otherwise, it applies to the embodiment of the circuit according to the invention shown in FIG. 4, in which the switching devices 10 and the control and evaluation unit 11 each have a telegram unit (not shown), that the telegram units of the switching devices 10 are made such that an address can be stored in them, that they can process a received telegram and that, optionally, they can send a received telegram after processing. Here, the telegram units of switching devices 10 are serviceable only when there is an enabling signal on them. For this reason, each of the telegram units of the switching devices 10, have an enabling signal input 19 in addition to telegram input 17 and telegram output 18. Enabling signal inputs 19 of the telegram units of all switching devices 10 are connected to enabling signal output 20 of control and evaluation unit 11.

For simplicity of illustration, it is not shown that telegram outputs 18 of the telegram units of all switching devices 10—decoupled from one another—are connected to one another and to control and evaluation unit 11, nor is it shown that switching devices 10, in addition to safety-relevant output 7, have an information input that is unrelated to safety considerations, the information outputs of all switching devices 10 being connected to one another and to control and evaluation unit 11. Because the telegram outputs 18 of the telegram units of all switching devices 10 are connected to the control and evaluation unit 11, the control and evaluation unit 11, when the ring of switching devices 10 and interconnecting cables 16 is not closed, can detect behind which switching device 10 the ring is interrupted.

Using the information outputs which are not safety-related, and which are also implemented in switching devices 10, states within the monitored system can be recorded which do not require a safety-related measure. For example, in an aerial railway or chairlift system, it can be detected that the actual position of cable 14 no longer exactly corresponds to the theoretical position without the deviation of the actual position from the theoretical position being so large that safety interventions are necessary. For example, the cable speed can be reduced in this case.

FIG. 5 shows that each switching device 10 can have three proximity indicators or three proximity switches 1, which for the following description are also labeled identified as by reference characters 1*a*, 1*b*, and 1*c*. These proximity indicators or proximity switches 1 are logically interconnected directly or indirectly on the output side. The following will now apply to these three proximity switches 1:

a) proximity switch 1*a* is unloaded when the actual position of cable 14 is the theoretical position, but loaded when the actual position of cable 14 is no longer in the theoretical position, but the actual position of cable 14 deviates from the theoretical position in the direction toward proximity switch 1*a*;

b) proximity switch 1*b* is loaded when the actual position of cable 14 is the theoretical position, but unloaded when the actual position of cable 14 is no longer in the theoretical position; and c) proximity switch 1*c* is unloaded when the actual position of cable 14 is the theoretical position, but loaded when the actual position of cable 14 is no longer in the theoretical position, but the actual position of cable 14 deviates from the theoretical position in the direction toward proximity switch 1*c*.

With these assumptions the following applies:

If all three proximity switches 1*a*, 1*b*, and 1*c* are unloaded, this is a safety-relevant criterion so that the circuit must immediately intervene.

If proximity switches 1*a* and 1*b* are loaded, but proximity switch 1*c* is unloaded, this is the criterion for the current position of cable 14 no longer agreeing exactly with the theoretical position. The same applies to the case in which proximity switches 1*b* and 1*c* are loaded, while proximity switch 1*a* is unloaded.

If only proximity switch 1*a* or only proximity switch 1*c* is loaded, this is the criterion for the current position of the cable 14 deviating dramatically from the theoretical position.

If all three proximity switches 1*a*, 1*b*, and 1*c* are loaded, this is an undefined state. The circuit must immediately intervene in this case as well.

If proximity switches 1*a* and 1*c* are unloaded, but proximity switch 1*b* is loaded, this is the criterion for the current position of cable 14 agreeing exactly with the theoretical position.

It will now be explained below how in the preferred embodiment of the circuit shown in FIG. 4, telegrams can appear and how these telegrams can be received, processed and transmitted by telegram units in switching devices 10. Here, it is assumed:

a) that each telegram is formed of two telegram components, with any number of bits;

b) that the first telegram component of a telegram originating from the control and evaluation unit 11 can contain an addressing command A and when the first telegram component contains addressing command A, the second telegram component contains an address B and address B is to be stored, unless it is already stored;

c) that, otherwise, in each telegram, the first telegram component contains address B and the second telegram component contains either processing command C or state information D of the corresponding monitoring and detection device 1;

d) that, when the first telegram component contains address B and the receiving switching device 10 has exactly this address B, "addressed" switching device 10 sends a telegram with a first telegram component which contains the address B of the sending switching device 10 and with a second telegram component which contains state information D of the sending switching device 10 and additional "telegram processed" information E; and e) when the telegram unit of a switching device 10 receives a telegram with a first telegram component which contains the address B and with a second telegram component which contains additional information E, the telegram unit of this switching device 10 sends a telegram with the first telegram component which contains "Addressing error" addressing information F and with a second telegram component which contains address B.

Thus, among others, the following telegram and processing situations are possible:

1. First switching device 10 (or any switching device 10) is not to be addressed. Control and evaluation unit 11 sends a telegram with a first telegram component which contains address command A and with a second telegram component which contains address B. This telegram causes the first switching device 10 to send address B and the telegram unit of this switching device 10 to send a telegram with a first telegram component which contains address B and with a second telegram component which contains state information D and additional information E.

2. Now, the switching device 10 which receives the telegram with first telegram component which contains the address B and with the second telegram component which does not contain additional information E is examined. The telegram unit of corresponding switching device 10 processes the received telegram and sends a telegram with a first telegram component which contains address B and with a second telegram component which contains state information D and additional information E.

3. Next, in turn, the switching device 10 is examined which has address B. The telegram unit of this switching device 10 receives a telegram with a first telegram component which contains address B, while the second telegram component contains processing command C, but does not contain additional information E. The telegram unit of this switching device 10 now works according to processing command C, for example, executes parameterization, and sends a telegram with a first telegram component which contains address B and with a second telegram component which contains state information D and additional information E.

4. Now, switching device 10 with address B is examined which receives a telegram with the first telegram component which contains address B, and with the second telegram component which contains additional information E. The telegram unit of this switching device 10 is also notified that the received telegram has already been processed by another switching device 10; this is recognized by additional information E. The telegram unit of this switching device 10 delivers a telegram with a first telegram component which contains addressing information F, while the second telegram component contains address B and additional information E.

5. Next, any switching device 10 which receives a telegram with a first telegram component which contains addressing information F and with a second telegram component which contains address B is examined. The telegram unit of this switching device 10 forwards the received telegram unchanged; therefore, the sent telegram contains the addressing information F in the first telegram component and address B in the second telegram component.

6. Then, the switching device 10 is examined which has address B. The telegram unit of this switching device 10 receives a telegram with a first telegram component which contains addressing command A and with a second telegram component which contains address B. The telegram unit of this switching device 10 delivers a telegram with a first telegram component which contains address B and with a second telegram component which contains addressing information F. With the received telegram address B should be set. However, since the address B has already been set, there is an addressing error.

7. Only one switching device 10 which has an address x, but not address B, is examined. This switching device 10 receives a telegram with a first telegram component which contains address B and with a second telegram component with additional information E. The telegram unit of this switching device 10 delivers a telegram which corresponds to the received telegram. The telegram unit of the corresponding switching device 10 has, therefore, recognized that the telegram with address B is intended for another monitoring and detection device 1.

8. Finally, let any switching device 10 with an address x other than address B be examined again. The telegram unit of this switching device 10 now receives a telegram with first telegram component which contains addressing command A and with second telegram component which contains address B. In this case as well, the telegram unit of this switching device 10 sends a telegram which corresponds exactly to the received telegram. Here, the telegram unit of this switching device 10 has also recognized that the telegram is intended for another monitoring and detection device 1.

In summary, it is pointed out again that, in the embodiment of the circuit according to the invention which is shown in FIG. 4, the following are implemented:

a) a control circuit which intervenes into a corresponding system when a safety-relevant criterion has been recognized, and b) interrogation and addressing possibilities.

Overall, according to the invention, a circuit has been devised which satisfies the highest safety requirements with comparatively low wiring cost and with which a fault can be easily located. While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

We claim:

1. Circuit for monitoring of operational states of a system, including detection of a fault state of the system, comprising a plurality of monitoring and detection devices and with at least one control and evaluation unit, the monitoring and detection devices being electronic switching devices, and each of the switching devices comprising a proximity indicator and an electronic switch which is controlled by the proximity indicator, the electronic switch being connected to a first input of an AND element, a second input of the AND element representing a control input of the switching device, an output of the AND element representing an output of the switching device, and a load current flowing via the AND element in a conductive state of the switching device; wherein said electronic switching devices are series connected to one another and to the control and evaluation unit; and wherein each of the switching devices is interrogatable with respect to a present circuit state thereof.

2. Circuit according to claim 1, wherein the proximity indicators are located so as to monitor the position of a cable on rollers of one of an aerial railway system and a chairlift system.

3. Circuit according to claim 1, wherein the output of a first of the switching devices is connected to a control input of a second of the switching devices, an output of the second of the switching devices is connected to a control input of a third of the switching devices, and an output of the third switching device is connected to control input of a fourth switching device.

4. Circuit according to claim 3, wherein a switch state of the switching devices is reversible by a reversing signal between make contact and break contact states.

5. Circuit according to claim 4, wherein each of the switching devices is addressable.

6. Circuit according to claim 5, wherein the switching devices and the control and evaluation unit form a ring with respect to the interrogation of the switching devices via respective interconnecting cables.

7. Circuit according to claim 4, wherein the switching devices and the control and evaluation unit form a ring with respect to the interrogation and addressing of the switching devices via respective interconnecting cables.

8. Circuit according to claim 7, wherein each of the switching devices and the control and evaluation unit have a telegram unit.

9. Circuit according to claim 8, wherein the telegram units of the switching devices have means for storing an address therein, for processing a received telegram and for sending a received telegram.

10. Circuit according to claim 9, wherein the telegram units are only operable only when there is an enabling signal on them.

11. Circuit according to claim 9, wherein telegram outputs of the telegram units, decoupled from one another, are connected to one another and to the control and evaluation unit.

12. Circuit according to claim 1, wherein each of the switching devices have an information input for information unrelated to the fault state of the system, and the information outputs of all switching devices are connected to one another and to the control and evaluation unit.

13. Circuit according to claim 1, wherein each switching device has three proximity indicators, said proximity indicators logically interconnected on an output side.

* * * * *